United States Patent
Kim et al.

(10) Patent No.: US 8,824,207 B2
(45) Date of Patent: Sep. 2, 2014

(54) SEMICONDUCTOR MEMORY DEVICE AND METHOD OF OPERATING THE SAME

(75) Inventors: Byung Ryul Kim, Seoul (KR); Duck Ju Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 34 days.

(21) Appl. No.: 13/601,882

(22) Filed: Aug. 31, 2012

(65) Prior Publication Data
US 2013/0163335 A1 Jun. 27, 2013

(30) Foreign Application Priority Data
Dec. 22, 2011 (KR) .......................... 10-2011-0140197

(51) Int. Cl.
*G11C 11/34* (2006.01)
(52) U.S. Cl.
USPC ................................ 365/185.12; 365/185.24

(58) Field of Classification Search
USPC ........................................ 365/185.12, 185.24
See application file for complete search history.

(56) References Cited

U.S. PATENT DOCUMENTS

2007/0061538 A1* 3/2007 Chang et al. .................. 711/169

* cited by examiner

*Primary Examiner* — Michael Tran
(74) *Attorney, Agent, or Firm* — William Park & Associates Ltd.

(57) ABSTRACT

A semiconductor memory device is operated by, inter alia, sequentially inputting program data to page buffers coupled to selected pages of at least four planes in order to program selected memory cells included in the selected pages; performing a program operation on each of the four planes; performing a program verify operation on each of the four planes; and inputting new program data for next pages to the page buffers coupled to the next pages, after determining the selected pages of at least two of the four planes have passed the program verify operation, while performing the program operations and the program verify operations on the two remaining planes.

19 Claims, 4 Drawing Sheets

SEMICONDUCTOR MEMORY DEVICE AND METHOD OF OPERATING THE SAME

CROSS-REFERENCE TO RELATED APPLICATION

Priority to Korean patent application number 10-2011-0140197 filed on Dec. 22, 2011, the disclosure of which is incorporated by reference herein in its entirety.

BACKGROUND

1. Technical Field

An embodiment of this disclosure relates to a semiconductor memory device and a method of operating the same. Additionally an embodiment of this disclosure relates to a semiconductor memory device and a method of programming the same. These embodiments are capable of increasing the density and the operating speed of the semiconductor memory device and the method of operating and programming the same.

A semiconductor device includes a memory cell array configured to store data and page buffers coupled to the memory cell array through bit lines. The memory cell array includes a plurality of planes each including a plurality of memory blocks. In general, the memory cell array includes two planes, that is, a first plane and a second plane.

In order to use the two planes, page buffers each including a plurality of latches are necessary. More specifically, each of the page buffers includes a cache latch configured to store program data or read data, a main latch configured to store data in program and read operations, a flag latch configured to perform an operation using flag cells, and a temporary latch used in a double verify operation.

2. Related Art

The program operation of the semiconductor memory device including the two planes is described below.

In order to perform program operations for selected pages of the first and the second planes, program data is sequentially input into the page buffers coupled to the first and the second planes. The program operations on the first and the second planes are performed by using the program data input into the page buffers. For example, when the program operation on the first plane is completed before the program operation on the second plane, program data to be used in a program operation on a next page is input into the cache latches of the page buffers coupled to the first plane, while the program operation on the second plane is performed.

If, as described above, program data for the next program operation on the one plane, on which the program has been completed, is input into one plane while a program operation on the other plane is being performed, the time taken for a program operation can be reduced even though only two planes are being used.

However, when using only two planes, there is a limit to increasing the density and operating speeds of the semiconductor devices.

BRIEF SUMMARY

For example, in an embodiment, the density of a semiconductor memory device can be increased and the time taken for a program operation can be reduced by providing a semiconductor memory device including at least four planes.

A method of operating a semiconductor memory device according to an aspect of the present disclosure includes sequentially inputting program data to page buffers coupled to selected pages of at least four planes in order to program selected memory cells included in the selected pages; performing a program operation on each of the four planes; performing a program verify operation on each of the four planes; and inputting new program data for next pages to the page buffers coupled to the next pages, after determining the selected pages of at least two of the four planes have passed the program verify operation, while performing the program operations and the program verify operations on the two remaining planes.

A method of operating a semiconductor memory device according to another aspect of the present disclosure includes inputting program data into $N^{th}$ pages of a first, second, third, and fourth page buffer groups coupled to a first, second, third, and fourth planes, respectively, and performing a program operation on each of the $N^{th}$ pages of the first, second, third, and fourth planes; performing a program verify operation on each of the $N^{th}$ pages; inputting program data for $(N+1)^{th}$ pages to the first and the second page buffer groups and performing a program operation on the $N^{th}$ pages of the third and the fourth planes, if, as a result of a program verify operation, the $N^{th}$ pages of the first and the second planes are determined to pass the program verify operation; inputting the program data into the $(N+1)^{th}$ pages of the third and the fourth page buffer groups and performing a program operation on the $(N+1)^{th}$ pages of the first and the second planes, if, as a result of the program verify operation, the $N^{th}$ pages of the third and the fourth planes are determined to pass the program verify operation; and performing a program operation on the $(N+1)^{th}$ pages of the first, second, third, and fourth planes by using the program data for the $(N+1)^{th}$ pages, if, as a result of the program verify operations, the $N^{th}$ pages of the first, second, third, and fourth planes are determined to pass the program verify operation.

A semiconductor memory device according to yet another aspect of the present disclosure includes a memory cell array configured to comprise a first, second, third, and fourth planes; a row decoder coupled to the first and the second planes and the third and the fourth planes; a first, second, third, and fourth page buffer groups coupled to the first, second, third, and fourth planes through bit lines and configured to store program data; a column selector configured to transfer the program data to the first, second, third, and fourth page buffer groups; and a controller configured to control the row decoder, the first, second, third, and fourth page buffer groups, and the column selector in order to sequentially input program data for a next page to the first and the second page buffer groups or the third and the fourth page buffer groups, if a program verify operation on the first and the second planes or the third and the fourth planes is determined to have passed during a program operation on the memory cell array.

DESCRIPTION OF EMBODIMENTS

Hereinafter, various embodiments of the present invention will be described with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
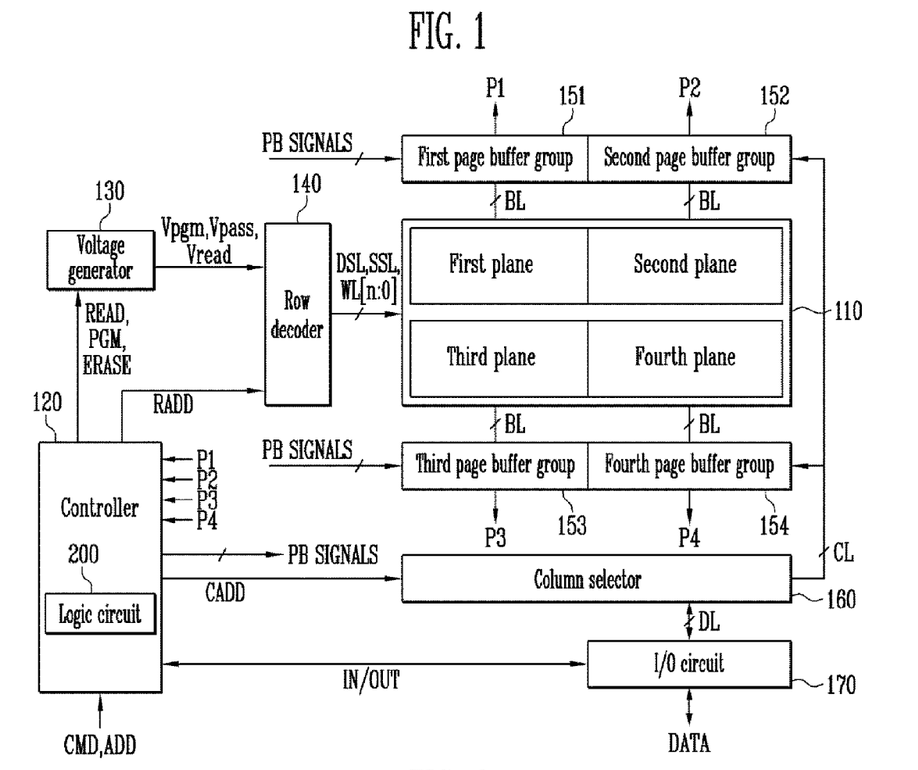
FIG. 1 is a block diagram of an example of a semiconductor memory device according to an embodiment of this disclosure.

FIG. 1 is an example of a block diagram of a semiconductor memory device according to an embodiment of this disclosure.

Referring to FIG. 1, the semiconductor memory device may include a memory cell array 110, a circuit group (130, 140, 151, 152, 153, 154, 160, and 170) configured to perform a program operation, a read operation, or an erase operation on memory cells included in the memory cell array 110. The semiconductor memory device may also include a controller 120 configured to control the circuit group (130, 140, 151, 152, 153, 154, 160, and 170) which may be used to set the threshold voltages of selected memory cells based on input data.

In the case of a NAND flash memory device, the circuit group may include a voltage generator 130, a row decoder 140, first to fourth page buffer groups 151, 152, 153, and 154, a column selector 160, and an input/output, I/O, circuit 170.

The memory cell array 110 may include, at least, four planes for storing data. It may be assumed hereinafter that the semiconductor memory device includes four planes. The four planes may include a first plane, a second plane, a third plane, and a fourth plane. The first to fourth planes may have the same construction. From among the four planes, the first and the second planes may form a pair, and the third and the fourth planes may form a pair. The plane will be described in detail later with reference to FIG. 2.

The controller 120 may internally generate a program operation signal PGM, a read operation signal READ, or an erase operation signal ERASE in response to a command signal CMD and may generate page buffer signals PB SIGNALS for controlling the page buffers (not shown) of the first to fourth page buffer groups 151, 152, 153, and 154 depending on the type of an operation.

Furthermore, the controller 120 may internally generate a row address RADD and a column address CADD, in response to an address signal ADD. In response to the row address RADD, one of the first to fourth planes included in the memory cell array 110 may be selected, one of a plurality of memory blocks included in the selected plane may be selected, and one of the plurality of page pages included in the selected memory block may be selected. In response to the column address CADD, the page buffers of the first to fourth page buffer groups 151, 152, 153, and 154 may be selected.

Also, the controller 120 may include a logic circuit 200 for controlling a program operation in response to first to fourth verify signals P1, P2, P3, and P4, generated from the first to fourth page buffer groups 151, 152, 153, and 154, respectively, in the program operation.

The logic circuit 200 may determine the planes on which the program has been completed in response to the first to fourth verify signals P1, P2, P3, and P4 and control the program data input operation for the next program operation on the planes according to a result of the determination. The logic circuit 200 will be described in detail later with reference to FIG. 5.

The voltage generator 130 may output operating voltages (for example, Vpgm, Vpass, and Vread) for programming, reading, or erasing memory cells) to global lines in response to the operating signals PGM, READ, ERASE (that is, internal command signals) of the controller 120.

The row decoder 140 may transfer the operating voltages Vpgm, Vpass, and Vread of the voltage generator 130 to local lines drain select line (DSL), source select line (SSL), and word line [zero to n] (WL[n:0]) that may be coupled to selected memory blocks of the first to fourth planes in response to the row address RADD of the controller 120.

The first to fourth page buffer groups 151, 152, 153, and 154 may detect the program state or the erase state of memory cells under the control of the controller 120. The first to fourth page buffer groups 151, 152, 153, and 154 may include the page buffers (not shown) coupled to the first to fourth planes through bit lines BL. The page buffers may supply the bit lines BL with voltages necessary to store data in selected memory cells of the first to fourth planes in response to the page buffer signals PB SIGNALS.

Additionally, the first to fourth page buffer groups 151, 152, 153, and 154 may precharge the bit lines BL within a program operation, a read operation, or an erase operation performed on the memory cells or latch data, corresponding to the threshold voltages of memory cells which are detected, according to a shift in the voltages of the bit lines BL. That is, the first to fourth page buffer groups 151, 152, 153, and 154 may supply the bit lines BL with a program permission voltage (for example, 0 V) or a program inhibition voltage (for example, Vcc) based on the latched data in a program operation and detect data stored in memory cells by controlling the voltages of the bit lines BL based on the data stored in the memory cells in a read operation.

The column selector 160 may input program data to the page buffers of the first to fourth page buffer groups 151, 152, 153, and 154, coupled thereto through column lines CL, in response to the column address CADD.

The input/output I/O circuit 170 may transfer program data DATA to the column selector 160 in a program operation and externally output data DATA received from the column selector 160 in a read operation, in response to an I/O signal IN/OUT generated from the controller 120.

Figure 2:
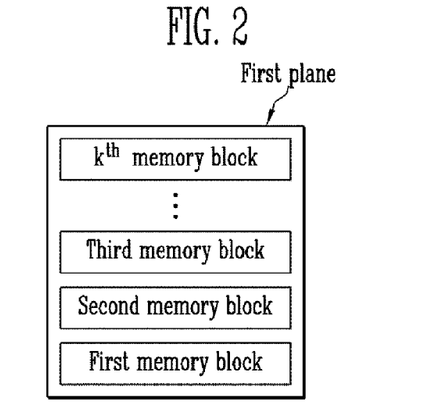
FIG. 2 is an example of a block diagram of a first plane shown in FIG. 1.

FIG. 2 is an example of a block diagram of the first plane shown in FIG. 1.

Here, only the first plane is described as an example and a description of the second to fourth planes is omitted, for simplicity, because each of the second to fourth planes has the same construction as the first plane. Referring to FIG. 2, the first plane includes first to $k^{th}$ memory blocks.

Figure 3:
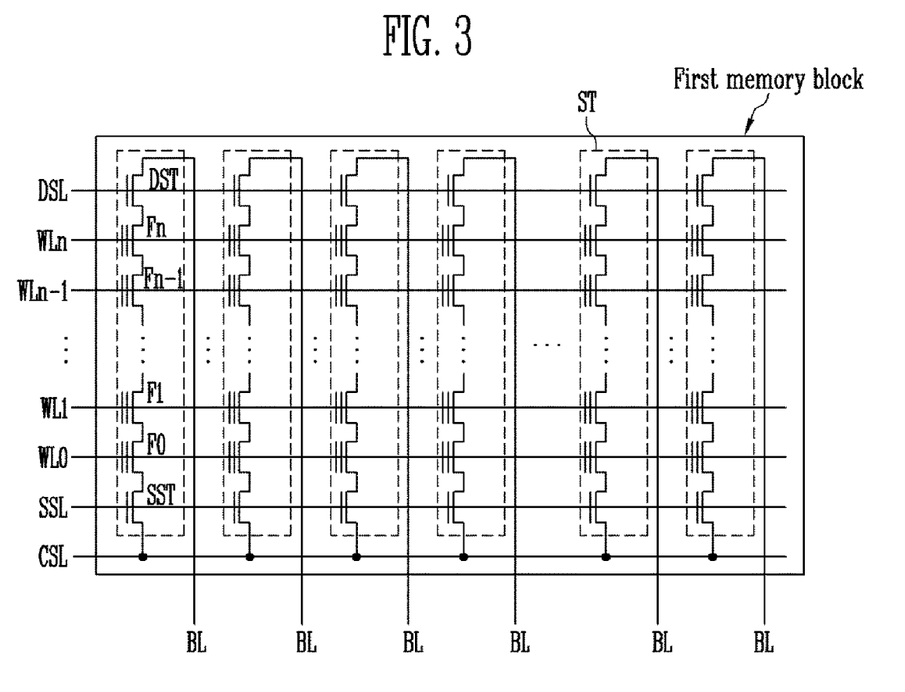
FIG. 3 is an example of a circuit diagram of a first memory block shown in FIG. 2.

FIG. 3 is an example of a circuit diagram of the first memory block shown in FIG. 2.

Here, only the first memory block is described as an example and a description of the second to $k^{th}$ memory blocks is omitted, for simplicity, because each of the second to $k^{th}$ memory blocks has the same construction as the first memory block.

Referring to FIG. 3, the first memory block includes a plurality of strings ST. The strings ST are coupled between the respective bit lines BL and a common source line CSL and configured to have the same construction. The construction of the string ST is described in detail below. The string ST may include a source select transistor SST coupled to the common source line CSL, a plurality of memory cells F0 to Fn (i.e., F0, F1, Fn−1, and Fn), and a drain select transistor DST coupled to the bit line BL. The gate of the source select transistor SST may be coupled to a source select line SSL, the gates of the memory cells F0 to Fn may be coupled to respective word lines WL0 to WLn (i.e., WL0, WL1, WLn−1, and WLn), and the gate of the drain select transistor DST may be coupled to a drain select line DSL.

Figure 4:
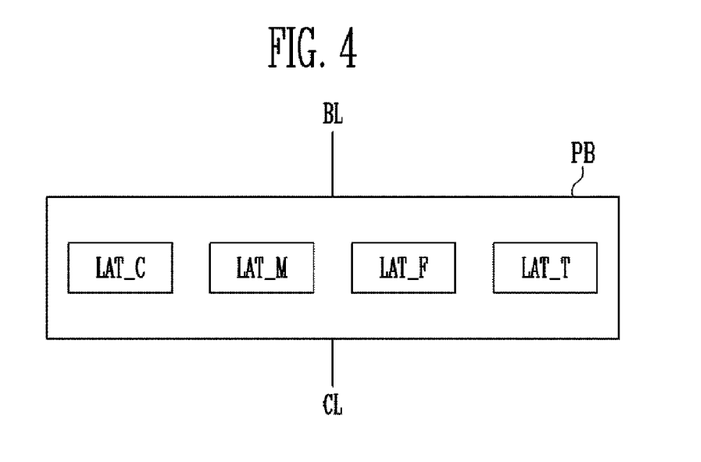
FIG. 4 is an example of a schematic block diagram of a page buffer shown in FIG. 1.

FIG. 4 is an example of a schematic block diagram of a page buffer as discussed above with relation to FIG. 1.

The page buffers discussed with relation to FIG. 1 may be included in the first to fourth page buffer groups 151, 152, 153, and 154. Each of the page buffers may have the same construction. As an example, only one page buffer PB is shown in FIG. 4.

Referring to FIG. 4, the page buffer PB may include a latch for storing program data or to read data from memory cells. In order to perform a cache program operation by using the four planes shown in FIG. 1, the page buffer PB may need to include at least four latches. Additionally, the page buffer PB may include a cache latch LAT_C for storing program data or read data, a main latch LAT_M for storing data in program and read operations, a flag latch LAT_F for performing an operation using flag cells, and a temporary latch LAT_T for performing a double verify operation. The cache latch LAT_C and the main latch LAT_M may be used in the cache program operation.

Also, when a program operation is started, program data input into the page buffer PB may be input into the cache latch LAT_C, and data input into the cache latch LAT_C may be transferred to the main latch LAT_M. The data transferred to the main latch LAT_M may be incorporated into the bit line BL coupled to the page buffer PB, and thus selected memory cells are programmed. After the selected memory cells are programmed, the next program data may be input into the cache latch LAT_C. Likewise, the data input into the cache latch LAT_C may be transferred to the bit line BL via the main latch LAT_M.

Figure 5:
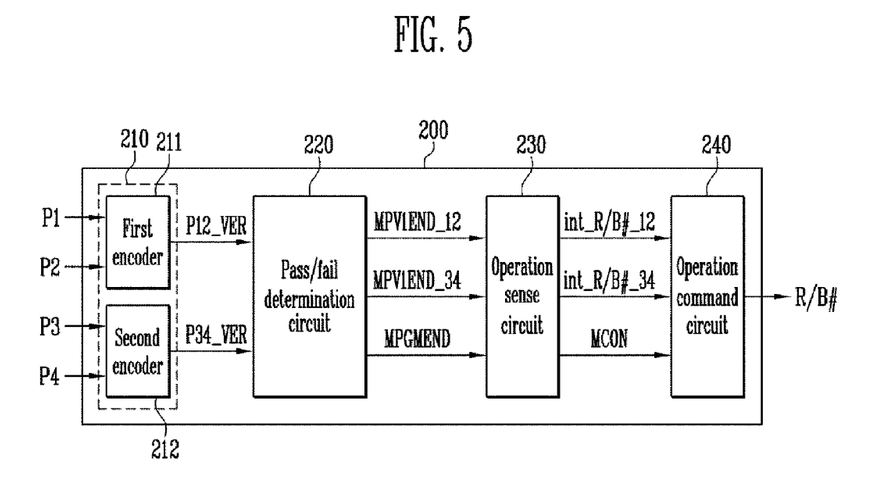
FIG. 5 is an example of a block diagram of a logic circuit shown in FIG. 1.

FIG. 5 is an example of a block diagram of the logic circuit 200 shown in FIG. 1.

Referring to FIG. 5, the logic circuit 200 may include a plane group sense circuit 210, a pass/fail determination circuit 220, an operation sense circuit 230, and an operation command circuit 240.

The plane group sense circuit 210 may include a first encoder 211 and a second encoder 212. The first encoder 211 may generate a first group verify signal P12_VER in response to the first verify signal P1 of the first plane and the second verify signal P2 of the second plane. The second encoder 212 may generate a second group verify signal P34_VER in response to the third verify signal P3 of the third plane and the fourth verify signal P4 of the fourth plane.

The first encoder 211 may be formed of an AND gate or a NAND gate because it may have to generate the first group verify signal P12_VER when a program operation on selected pages of the first and the second planes are completed. The second encoder 212 may be formed of an AND gate or an NAND gate because it may have to generate the second group verify signal P34_VER when a program operation on selected pages of the third and the fourth planes are completed.

In the present embodiment, an example in which each of the first encoder 211 and the second encoder 212 is formed of an AND gate is described. When the AND gate is used, the first encoder 211 may output the first group verify signal P12_VER at a high level when both the first verify signal P1 and the second verify signal P2 have high levels and may output the first group verify signal P12_VER at a low level in other cases. Likewise, the second encoder 212 may output the second group verify signal P34_VER at a high level when both the third verify signal P3 and the fourth verify signal P4 have a high level and may output the second group verify signal P34_VER at a low level in other cases.

The pass/fail determination circuit 220 may generate a first operation completion signal MPV1END_12, a second operation completion signal MPV1END_34, and a program completion signal MPGMEND in response to the first group verify signal P12_VER and the second group verify signal P34_VER.

For example, when the first group verify signal P12_VER having a logic high level and the second group verify signal P34_VER having a logic low level are received, the pass/fail determination circuit 220 may output the first operation completion signal MPV1END_12 having a logic high level, but it may output the second operation completion signal MPV1END_34 and the program completion signal MPGMEND at a logic low level. Additionally, the pass/fail determination circuit 220 may output the first operation completion signal MPV1END_12 having a logic high level, if a program operation on the selected pages of the first and the second planes has been completed, eventhough a program operation on any one of the selected pages of the third or fourth planes has not been completed.

In contrast, when the first group verify signal P12_VER having a logic low level and the second group verify signal P34_VER having a logic high level are received, the pass/fail determination circuit 220 may output the second operation completion signal MPV1END_34 having a logic high level, but it may output the first operation completion signal MPV1END_12 and the program completion signal MPGMEND at a logic low level. Also, the pass/fail determination circuit 220 may output the second operation completion signal MPV1END_34 having a logic high level, if a program operation on selected pages of the third and the fourth planes has been completed, eventhough a program operation on any one of selected pages of the first or second plane has not been completed. When the first and the second group verify signals P12_VER and P34_VER having a logic high level are received, it may mean that a program operation of the selected pages of the first to fourth planes has been fully completed. Thus, the pass/fail determination circuit 220 may output the program completion signal MPGMEND having a logic high level, but output the second operation completion signal MPV1END_34 and the first operation completion signal MPV1END_12 having a logic low level.

The operation sense circuit 230 may generate a first group operation signal int_R/B#_12, a second group operation signal int_R/B#_34, and a state notification signal MCON in response to the first and the second operation completion signals MPV1END_12 and MPV1END_34 and the program completion signal MPGEND.

More specifically, when the first operation completion signal MPV1END_12 having a logic high level is received, the operation sense circuit 230 outputs the first group operation signal int_R/B#_12 having a logic high level. When the second operation completion signal MPV1END_34 has a logic high level, then the operation sense circuit 230 may output the second group operation signal int_R/B#_34 having a logic high level. When any one of the first group operation signals int_R/B#_12 and the second group operation signals int_R/B#_34 are outputted as a logic high level, the state notification signal MCON may also be output at a logic high level. The state notification signal MCON may be used to inform a user that the cache latches LAT_C of some of the page buffers are empty.

The operation command signal 240 generates a ready/busy signal R/B# by performing an OR operation on the first group operation signal int_R/B#_12 and the second group operation signal int_R/B#_34. Whenever the ready/busy signal R/B# having a logic high level is outputted, an operation of inputting program data to the cache latch LAT_C of a selected page buffer has been performed.

Figure 6:
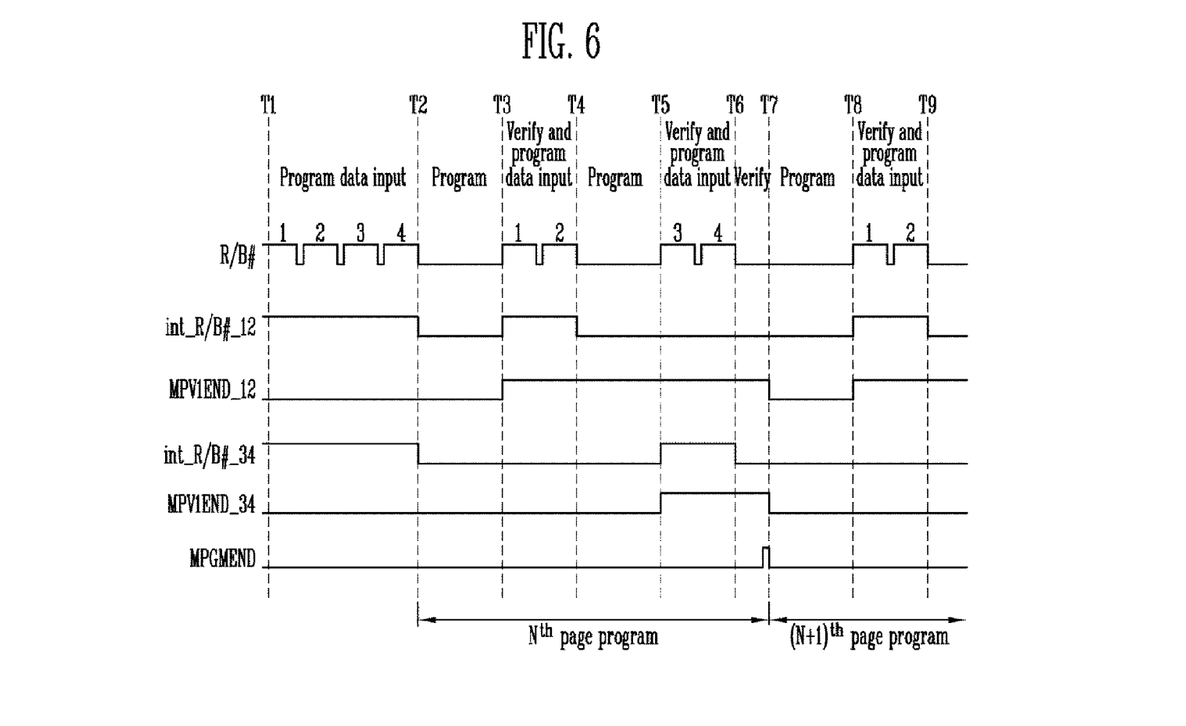
FIG. 6 is an example of a detailed timing diagram illustrating the operation of a logic circuit during a program operation.

FIG. 6 is an example of a timing diagram illustrating the operation of the logic circuit 200 during a program operation.

The operation of the logic circuit 200 is described below with reference to FIG. 6.

Program Data Input Section T1-T2

When a program operation is started, the first group operation signal int_R/B#_12 and the second group operation signal int_R/B#_34 each having a logic high level may be output. While both the first group operation signal int_R/B#_12 and the second group operation signal int_R/B#_34 maintain a logic high level, the ready/busy signal R/B# may toggle four times having logic high for four intervals of time, that is, 1, 2, 3, and 4 intervals as illustrated in FIG. 6. Additionally, at the same time, program data for $N^{th}$ pages may be sequentially input into the cache latches LAT_C of the first to fourth page buffer groups 151, 152, 153, and 154.

In FIG. 6, numbers 1, 2, 3, 4 related to the ready/busy signal R/B# correspond to the first plane, the second plane, the third plane, and the fourth plane, respectively. That is, during the program data input section T1-T2 (i.e., time 1 to time 2), the ready/busy signal R/B# shifts to a logic high level as indicated by '1, 2, 3, 4'. Accordingly, the program data for an $N^{th}$ page may be input into the first page buffer group 151 corresponding to the first plane (1), the program data for an $N^{th}$ page is inputted to the second page buffer group 152 corresponding to the second plane (2), the program data for an $N^{th}$ page is inputted to the third page buffer group 153 corresponding to the third plane (3), and the program data for an $N^{th}$ page is inputted to the fourth page buffer group 154 corresponding to the fourth plane in this order.

Particularly, since the first and the second planes form a pair and the third and the fourth planes form a pair, the row decoder 140 may select the same memory blocks of the first and the second planes, the same pages of the selected memory blocks, the same memory blocks of the third and the fourth planes, and the same pages of the selected memory blocks. Accordingly, the selected pages of the first and the second planes may be substantially identical with each other, and the selected pages of the third and the fourth planes may be substantially identical with each other. To this end, the row decoder 140 may control the first and the second planes and the third and the fourth planes. Accordingly, the selected pages of the first and the second planes may differ from the selected pages of the third and the fourth planes. However, when first program data is input after a program operation has started, the same pages (that is, the first pages) of the first to fourth planes are selected, and the program data for the first pages may be input into the respective cache latches LAT_C of the page buffers. For reference, the cache latched LAT_C may be included in the first to fourth page buffer groups 151, 152, 153, and 154, respectively.

Program Section T2-T3

A program operation may be performed by using the program data input into the first to fourth page buffer groups 151, 152, 153, and 154. Additionally, all the program data for the $N^{th}$ pages, input into the cache latches LAT_C of the first to fourth page buffer groups 151, 152, 153, and 154, may be transferred to the main latches LAT_M. Also, the main latches LAT_M and the respective bit lines BL may be coupled in order to incorporate the program data into the bit lines BL.

For example, when the program data is '0', a program permission voltage 0V may be supplied to the bit lines BL. Thus, when a program voltage is supplied to word lines coupled to the $N^{th}$ pages, the threshold voltages of the memory cells coupled to the bit lines BL may rise. In contrast, when the program data is '1', a program inhibition voltage Vcc may be supplied to the bit lines BL. Thus, although the program voltage is supplied to the word lines coupled to the $N^{th}$ pages, the threshold voltages of the memory cells coupled to the bit lines BL may maintain an erase state. Here, since the memory cells have different electrical characteristics, the speed of the threshold voltages of the programmed memory cells may differ. During the program section T2-T3 (i.e., time 2 to time 3) where the program operation is performed, all the ready/busy signal R/B#, the first group operation signal int_R/B#_12, and the second group operation signal int_R/B#_34 shift to a logic low level.

Verify and Program Data Input, Section T3-T4

A program verify operation may be performed in order to check whether the threshold voltages of selected memory cells (that is, memory cells to be programmed) included in the $N^{th}$ pages of the first to fourth planes have reached a target level. The program verify operation may be performed on all the selected memory cells of the first to fourth planes. Here, the first and the second planes are classified into a first group, the third and the fourth planes are classified into a second group, and the verify operation may be performed on the first and the second groups.

In other words, a result of the program verify operation on the first group may pass only when the threshold voltages of all the selected memory cells of the first and the second planes reach the target logic level. Furthermore, a result of the program verify operation on the second group may be a pass, only when the threshold voltages of all the selected memory cells pertaining to the third and the fourth planes reach the target logic level. If the result of the program verify operation on the first and the second groups is not a pass, then the program operation may be repeated while gradually raising the program voltage until the result of the program verify operation on the first and the second groups pass.

For example, if the result of the program verify operation on the first group is a pass, but a result of the program verify operation on the second group is not a pass as depicted in section T3-T4 of FIG. 6, then the first group operation signal int_R/R#_12 may shift to a logic high level, but the second group operation signal int_R/B#_34 may maintain a logic low level. At substantially the same time, the first operation completion signal MPV1END_12, informing that the program operation on the $N^{th}$ pages of the first group has been completed, shifts to a logic high level.

When the program operation on the $N^{th}$ pages of the first group is completed as described above, the cache latches LAT_C of the page buffers of the first and the second page buffer groups 151 and 152, are classified as the first group to become empty. Accordingly, whenever the ready/busy signal R/B# shifts to a logic high level (1, 2), program data for a program operation on $(N+1)^{th}$ pages (that is, next pages) may sequentially be input into the cache latches LAT_C of the first and the second page buffer groups 151 and 152. That is, although the program operation on the second group has not yet been completed, program data for a next program operation may be input into a group on which the program operation has been first completed, from among the first and the second groups. Accordingly, the time taken for a program operation may be reduced.

Program Section T4-T5

Since the program operation on the $N^{th}$ pages of the first and the second planes has been completed, a program operation may be performed on the third and the fourth planes which have not yet been programmed. During the program operation on the third and the fourth planes, the first and the second group operation signals int_R/B#_12 and int_R/B#_34 and the ready/busy signal R/B# maintain a logic low level, but the first operation completion signal MPV1END_12 may maintain a logic high level. That is, the first operation completion signal MPV1END_12 may inform that the program operation on the $N^{th}$ pages of the first group has been completed. Thus, the first operation completion signal MPV1END_12 may continue to maintain a logic high level while the program operation is being performed on the second group.

Verify and Program Data Input Section T5-T6

A program verify operation may be performed on the $N^{th}$ pages of the second group including the third and the fourth planes. If, as a result of the program verify operation, the threshold voltages of substantially all of the selected memory cells of the third and the fourth planes have reached the target level, the result of the program verify operation on the second group may be a pass. When the result of the program verify operation on the second group is a pass, the second group operation signal int_R/B#_34 and the second operation completion signal MPV1END_34 shift to a logic high level.

Particularly, while the second group operation signal int_R/B#_34 maintains a logic high level, the ready/busy signal R/B# also shifts to a logic high level. Whenever the ready/busy signal R/B# shifts to a logic high level (3, 4), program data for a program operation on $(N+1)^{th}$ pages may be sequentially input into the cache latches LAT_C of the third and the fourth planes. The time taken for a program operation may be reduced by inputting the next program data substantially at the same time as with a program verify operation as described above.

Verify Section T6-T7

Since the program operation on the first and the second groups (that is, the $N^{th}$ pages of the first to fourth planes) has been fully completed, the first and the second operation completion signals MPV1END_12 and MPV1END_34 may shift to a logic high level.

Additionally, in the verify section T6-T7 (i.e., time 6 to time 7), whether the program operation on the $N^{th}$ pages of the first to fourth planes has been fully completed may be finally checked in response to the first and the second operation completion signals MPV1END_12 and MPV1END_34.

When both the first and second operation completion signals MPV1END_12 and MPV1END_34, each having a logic high level, are detected, the program completion signal MPGMEND may shift to a logic high level. When the program completion signal MPGMEND shifts to a logic high level, the program operation on the $N^{th}$ pages of the first to fourth planes may be determined to have been fully completed. Accordingly, both the first and the second operation completion signals MPV1END_12 and MPV1END_34 may shift from a logic high level to a logic low level.

Program Section T7-T8

Since the program operation on the $N^{th}$ pages of the first to fourth planes has fully been completed, a program operation may be performed on the $(N+1)^{th}$ pages. The program data for the program operation on the $(N+1)^{th}$ pages has already been input into the latches of the page buffers in the program operation on the previous pages. Thus, the program operation on the $(N+1)^{th}$ pages may be immediately performed without performing on a program input operation on the $(N+1)^{th}$ pages. As described above, the total time taken for a program operation may be reduced because the time taken for the program data input operation on the $(N+1)^{th}$ pages may be reduced.

Verify and Program Data Input Section T8-T9

A program verify operation may be performed in order to check whether the threshold voltages of selected memory cells (that is, memory cells to be programmed) included in the $(N+1)^{th}$ pages of the first to fourth planes have reached the target logic level. The program verify operation may be performed on all of the selected memory cells of the $(N+1)^{th}$ pages of the first to fourth planes. Here, as described above, the first and the second planes may be classified into a first group, the third and the fourth planes may be classified into a second group, and the program verify operation may be performed on the first and the second groups.

In other words, the result of the program verify operation on the first group is passed only when the threshold voltages of all the selected memory cells of the first and the second planes reach the target logic level. Furthermore, the result of the program verify operation on the second group may be a pass only when the threshold voltages of all the selected memory cells of the third and the fourth planes reach a target logic level. If a result of the program verify operation on the first and the second groups is not a pass, the program operation may be repeated while gradually raising the program voltage until the result of the program verify operation on the first and the second groups is a pass.

For example, if a result of the program verify operation on the first group is a pass, but a result of the program verify operation on the second group is not a pass as in the section T8-T9 (time 8 to time 9) of FIG. 6, the first group operation signal int_R/R#_12 may shift to a logic high level, but the second group operation signal int_R/B#_34 maintains a logic low level. At substantially the same time, the first operation completion signal MPV1END_12, used to inform that the program operation on the $N^{th}$ pages of the first group has been completed, shifts to a logic high level.

When the program operation on the $N^{th}$ pages of the first group is completed as described above, the cache latches LAT_C of the page buffers of the first and the second page buffer groups 151 and 152 classified as the first group may be used. Accordingly, whenever the ready/busy signal R/B# shifts to a logic high level (1, 2), program data for a program operation on $(N+2)^{th}$ pages (that is, next pages) may be sequentially input into the cache latches LAT_C of the first and the second page buffer groups 151 and 152. That is, although the program operation on the second group has not yet been completed, program data for a next program operation may be input into a group on which the program operation has been first completed, from among the first and the second groups. Accordingly, the time taken for a program operation may be reduced.

As described above, the amount of data may be increased because four planes may be used and the time taken to input program data for the four planes is only for when a program operation is stated, but subsequently program data for the next pages may be inputted during the program operation. Accordingly, the time taken for a program operation may be reduced.

In the above operation, an example in which the program operation on the selected pages of the first and the second planes is completed earlier than the program operation on the selected pages of the third and the fourth planes has been described, but this is only one illustrative example amongst many examples. For example in another embodiment, the program operation on the selected pages of the third and the fourth planes may be completed earlier than the program operation on the selected pages of the first and the second planes.

Figure 7:
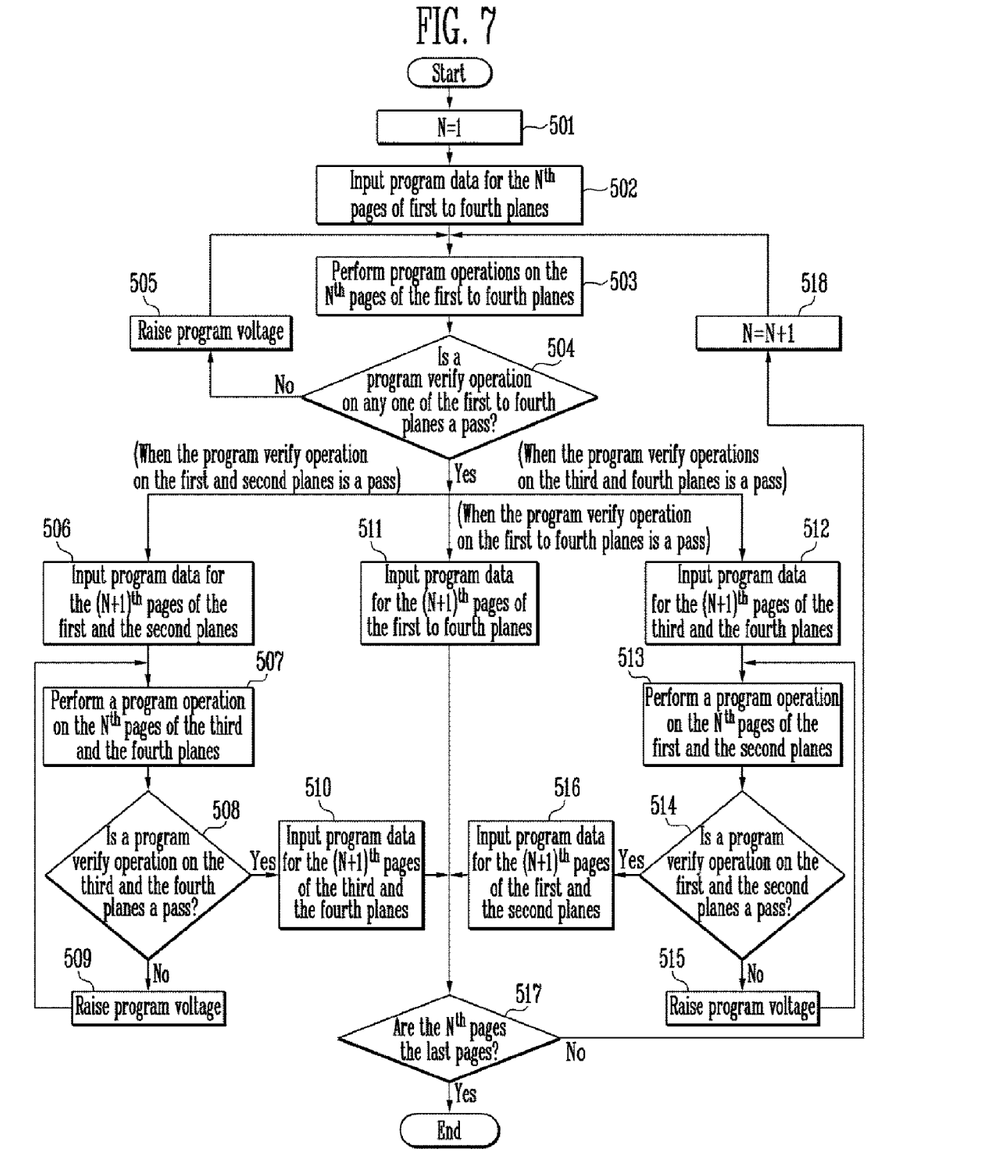
FIG. 7 is a flowchart illustrating an example of a program operation according to an embodiment of this disclosure.

FIG. 7 is a flowchart illustrating a program operation according to an embodiment of this disclosure.

Referring to FIG. 7, the program operation according to the embodiment of this disclosure is described below.

When a program command is input into the controller 120, an initial value N indicating a page order may be set to '1' at step 501. Program data for the $N^{th}$ pages of the first to fourth planes is sequentially input into the cache latches LAT_C of the page buffers at step 502. The program data input into the cache latches LAT_C may be transferred to the main latches LAT_M.

After the data is input into the main latches LAT_M it is incorporated into the bit lines BL, and a program operation may be performed on selected memory cells included in the $N^{th}$ pages by supplying a program voltage to the word lines WL coupled to the $N^{th}$ pages at step 503. The program operation may be performed in accordance with an incremental step pulse program (ISPP) of gradually raising the program voltage in order to narrow the width of a distribution of the threshold voltages of the selected memory cells.

After the program voltage is supplied to the selected word lines, a program verify operation may be performed on the selected memory cells in order to determine whether any one of the first to fourth planes is passing as a result of the program verify operation at step 504. Here, a plane that is determined to have passed, as a result of the program verify operation, refers to a plane in which the threshold voltages of all the selected memory cells included in the $N^{th}$ page have reached the target logic level.

If, as a result of the determination at step 504, any one of the first to fourth planes is determined not to be a pass, the program and verify operations corresponding to the steps 503 to 505 are repeated while gradually raising the program voltage until one or more of a group including the first and the second planes and a group including the third and the fourth planes are determined to a pass.

If, as a result of the determination at step 504, the first and the second planes are determined to be a pass, program data for the $(N+1)^{th}$ pages (that is, next pages) of the first and the second planes may be input because the cache latches LAT_C of the first and the second page buffer group 151 and 152 are available at step 506.

Next, a program operation may be performed on the $N^{th}$ pages of the third and the fourth planes in the state in which the program operation on the first and the second planes is inhibited at step 507. Next, a program verify operation may be performed on the $N^{th}$ pages of the third and the fourth planes in order to determine whether the program verify operation on the $N^{th}$ pages of the third and the fourth planes are deemed a pass at step 508.

If, as a result of the determination at step 508, the $N^{th}$ pages of the third and the fourth planes are determined not to be a pass, the program and verify operations corresponding to the steps 507 to 509 are repeated while gradually raising the program voltage at step 509 until the program operation on the $N^{th}$ pages of the third and the fourth planes is completed.

If, as a result of the determination at step 508, the $N^{th}$ pages of the third and the fourth planes are determined to be a pass, program data for the $(N+1)^{th}$ pages (that is, next pages) of the third and the fourth planes may be input at step 510 because the cache latches LAT_C of the third and the fourth page buffer groups 153 and 154 are available.

Next, the determination of whether the $N^{th}$ pages are the last pages within the selected memory blocks of the first to fourth planes is determined at step 517. If, as a result of the determination at step 517, it is determined that the $N^{th}$ pages are the last pages within the selected memory blocks, the program operation is completed. If, as a result of the determination at step 517, it is determined that the $N^{th}$ pages are not the last pages within the selected memory blocks, the program operation is repeated while increasing the page order at step 518 until the program operation on all the pages within the selected memory blocks of the first to fourth planes is completed.

If, as a result of the determination at step 504, the third and the fourth planes are determined to have passed, program data for the $(N+1)^{th}$ pages (that is, next pages) of the third and the fourth planes is input at step 512 because the cache latches LAT_C of the third and the fourth page buffer group 153 and 154 are available.

Next, a program operation may be performed on the $N^{th}$ pages of the first and the second planes in a state in which the program operation on the first and the second planes is inhibited at step 513. Next, a program verify operation may be performed on the $N^{th}$ pages of the first and the second planes in order to determine whether a result of the program verify operation on the $N^{th}$ pages of the first and the second planes has passed, at step 514.

If, as a result of the determination at step 514, the $N^{th}$ pages of the first and the second planes are determined not to be a pass, the program and verify operations corresponding to steps 513 to 515 may be repeated while gradually raising the program voltage at step 515 until the program operation on the $N^{th}$ pages of the first and the second planes are completed.

If, as a result of the determination at step 514, the $N^{th}$ pages of the first and the second planes are determined to have passed, program data for the $(N+1)^{th}$ pages (that is, next pages) of the first and the second planes may be input at step 516 because the cache latches LAT_C of the first and the second page buffer groups 151 and 152 are available.

Next, whether the $N^{th}$ pages are the last pages within the selected memory blocks of the first to fourth planes may be determined at step 517. If, as a result of the determination at step 517, it is determined that the $N^{th}$ pages are the last pages within the selected memory blocks, the program operation is completed. If, as a result of the determination at step 517, it is determined that the $N^{th}$ pages are not the last pages within the selected memory blocks, the program operation may be repeated while increasing the page order at step 518 until the program operation on all the pages within the selected memory blocks of the first to fourth planes is completed.

If, as a result of the determination at step 504, the program verify operation on all the first to fourth planes is determined to be a pass, program data for the (N+1)$^{th}$ pages (that is, next pages) of the first to fourth planes may be input at step 511 because the cache latches LAT_C of the first to fourth page buffer groups 151, 152, 153, and 154 are available. Next, whether the N$^{th}$ pages are the last pages within the selected memory blocks of the first to fourth planes may be determined at step 517. If, as a result of the determination at step 517, it is determined that the N$^{th}$ pages are the last pages within the selected memory blocks, the program operation is completed. If, as a result of the determination at step 517, it is determined that the N$^{th}$ pages are not the last pages within the selected memory blocks, the program operation may be repeated while increasing the page order at step 518 until the program operation on all the pages within the selected memory blocks of the first to fourth planes is completed.

In accordance with this disclosure, when a program operation is performed as described above, four planes may be programmed in parallel, concurrently, or at substantially the same time. Additionally, more data can be processed than the data amount processed when using two planes is used and the time taken for a program operation can be reduced because the time taken to input program data for a next page can be reduced.

Furthermore, since at least four planes are used, more data can be stored as compared with the case where two planes are used. Accordingly, the time taken for a program operation to program an increased amount of the density may be reduced.

What is claimed is:

1. A method of operating a semiconductor memory device, comprising:
    sequentially inputting program data to page buffers coupled to selected pages of at least one of four planes in order to program selected memory cells included in the selected pages;
    performing a program operation on each of the four planes;
    performing a program verify operation on each of the four planes; and
    inputting new program data for next pages to the page buffers coupled to at least two planes on which the program verify operation passes, among the four planes, while performing the program operation and the program verify operation on remaining planes.

2. The method of claim 1, wherein the program operation on the four planes is concurrently performed.

3. The method of claim 1, wherein sequentially inputting program data to page buffers comprises:
    sequentially inputting the program data to cache latches included in the respective page buffers.

4. The method of claim 3, wherein sequentially inputting program data to page buffers further comprises:
    sending the program data to main latches included in the respective page buffers.

5. A method of operating a semiconductor memory device, comprising:
    inputting program data into N$^{th}$ pages of a first, second, third, and fourth page buffer groups coupled to a first, second, third, and fourth planes, respectively, and performing a program operation on each of the N$^{th}$ pages of the first, second, third, and fourth planes;
    performing a program verify operation on each of the N$^{th}$ pages;
    inputting program data for (N+1)$^{th}$ pages to the first and the second page buffer groups and performing a program operation on the N$^{th}$ pages of the third and the fourth planes, if, as a result of a program verify operation, the N$^{th}$ pages of the first and the second planes are determined to pass the program verify operation;
    inputting the program data into the (N+1)$^{th}$ pages of the third and the fourth page buffer groups and performing a program operation on the (N+1)$^{th}$ pages of the first and the second planes, if, as a result of the program verify operation, the N$^{th}$ pages of the third and the fourth planes are determined to pass the program verify operation; and
    performing a program operation on the next pages of the first, second, third, and fourth planes by using the program data for the (N+1)$^{th}$ pages, if, as a result of the program verify operations, the N$^{th}$ pages of the first, second, third, and fourth planes are determined to pass the program verify operation.

6. The method of claim 5, wherein when inputting program data for N$^{th}$ pages of first, second, third, and fourth page buffer groups, the program data is sequentially input into cache latches included in a respective page buffer of the first, second, third, and fourth page buffer groups.

7. The method of claim 6, wherein inputting program data for N$^{th}$ pages of the first, second, third, and fourth page buffer groups further comprises:
    transferring the program data from the cache latches to main latches included in the respective page buffer.

8. The method of claim 7, wherein the program operations on the first, second, third, and fourth planes are performed by using the program data transferred into the main latches.

9. The method of claim 5, further comprising repeating the program operations on any one of the N$^{th}$ pages, while gradually raising a program voltage, if, as a result of the program verify operations, all of the N$^{th}$ pages of the first, second, third, and fourth planes are determined not to pass the program verify operation or any one of the N$^{th}$ pages of any one of the first and the second planes and the any one of the N$^{th}$ pages of any one of the third and the fourth planes are determined not to pass the program verify operation.

10. The method of claim 5, wherein performing a program operation on the N$^{th}$ N pages of the third and the fourth planes includes performing the program operation on the N$^{th}$ pages of the third and the fourth planes while gradually raising a program voltage, until the program verify operation on the N$^{th}$ pages of the third and the fourth planes passes the program verify operation, in a state in which the program verify operation for the first and the second planes are inhibited from determining whether or not a pass has occurred.

11. The method of claim 5, wherein performing a program operation on the N$^{th}$ pages of the first and the second planes includes performing the program operation on the N$^{th}$ pages of the first and the second planes while gradually raising a program voltage, until the program verify operation on the N$^{th}$ pages of the first and the second planes passes the program verify operation, in a state in which the program verify operation for the third and the fourth planes are inhibited from determining whether or not a pass has occurred.

12. A semiconductor memory device, comprising:
    a memory cell array configured to comprise a first, second, third, and fourth planes;
    a row decoder coupled to the first and the second planes and the third and the fourth planes;
    a first, second, third, and fourth page buffer groups coupled to the first, second, third, and fourth planes through bit lines and configured to store program data;
    a column selector configured to transfer the program data to the first, second, third, and fourth page buffer groups; and
    a controller configured to control the row decoder, the first, second, third, and fourth page buffer groups, and the column selector in order to sequentially input program data for a next page to the first and the second page buffer groups or the third and the fourth page buffer groups, if a program verify operation on the first and the second planes or the third and the fourth planes is determined to have passed during a program operation on the memory cell array.

13. The semiconductor memory device of claim 12, wherein:
the first, second, third, and fourth planes each comprise a plurality of memory blocks, and each of the memory blocks comprises a plurality of pages each including memory cells coupled to a word line.

14. The semiconductor memory device of claim 12, wherein the row decoder is coupled to the first and the second planes and the third and the fourth planes through word lines.

15. The semiconductor memory device of claim 12, wherein the first, second, third, and fourth page buffer groups are coupled to the first, second, third, and fourth planes, respectively.

16. The semiconductor memory device of claim 15, wherein:
each of the first, second, third, and fourth page buffer groups comprise a plurality of page buffers coupled to the bit lines, and each of the page buffers comprises a cache latch, a main latch, a flag latch, and a temporary latch.

17. The semiconductor memory device of claim 12, wherein the controller comprises a logic circuit for controlling a program data input operation and the program operation in response to first, second, third, and fourth verify signals, generated from the first, second, third, and fourth page buffer groups, during the program verify operation.

18. The semiconductor memory device of claim 17, wherein the logic circuit comprises:
a plane group sense circuit for generating a first group verify signal, informing whether the program verify operation on the first and the second planes passed, and a second group verify signal, informing whether the program verify operation on the third and the fourth planes passed, in response to the first, second, third, and fourth verify signals;
a pass/fail determination circuit for generating a first operation completion signal informing whether the program operation on selected pages of the first and the second planes is completed, a second operation completion signal informing whether the program operation on selected pages of the third and the fourth planes is completed, and a program completion signal informing whether the program operation on all the selected pages of the first, second, third, and fourth planes is completed, in response to the first and the second group verify signals;
an operation sense circuit for generating first and second group operation signals for a first group, including the first and the second planes, and a second group, including the third and the fourth planes, respectively, and a state notification signal in response to the first and the second operation completion signals and the program completion signal; and
an operation command circuit for generating a ready/busy signal for inputting the program data to the first and the second page buffer groups or the third and the fourth page buffer groups, in response to the first and the second group operation signals and the state notification signal.

19. The semiconductor memory device of claim 18, wherein the plane group sense circuit comprises:
a first encoder for generating the first group verify signal in response to the first and the second verify signals; and
a second encoder for generating the second group verify signal in response to the third and the fourth verify signals.

* * * * *